United States Patent
Crouch

(10) Patent No.: US 7,249,115 B2
(45) Date of Patent: Jul. 24, 2007

(54) NETWORK MODELLING

(75) Inventor: Simon Edwin Crouch, Bristol (GB)

(73) Assignee: Hewlett-Packard Development Company, L.P., Houston, TX (US)

(*) Notice: Subject to any disclaimer, the term of this patent is extended or adjusted under 35 U.S.C. 154(b) by 524 days.

(21) Appl. No.: 10/695,385

(22) Filed: Oct. 28, 2003

(65) Prior Publication Data

US 2005/0278268 A1    Dec. 15, 2005

(30) Foreign Application Priority Data

Apr. 5, 2003    (GB) ................................. 0307919.1

(51) Int. Cl.
*G06N 3/02* (2006.01)

(52) U.S. Cl. .......................... 706/26; 706/15; 706/21; 703/1

(58) Field of Classification Search .................. 706/26, 706/10, 38, 15, 21; 703/1
See application file for complete search history.

(56) References Cited

U.S. PATENT DOCUMENTS

| | | | |
|---|---|---|---|
| 5,099,434 A | | 3/1992 | Stoll et al. |
| 5,132,835 A | | 7/1992 | Stoll et al. |
| 5,377,307 A | | 12/1994 | Hoskins et al. |
| 5,404,423 A | * | 4/1995 | Uchiyama et al. ............ 706/23 |
| 5,440,719 A | * | 8/1995 | Hanes et al. .................. 703/21 |
| 5,509,106 A | * | 4/1996 | Pechanek et al. ............. 706/41 |
| 5,517,600 A | | 5/1996 | Shimokawa |
| 5,659,486 A | * | 8/1997 | Tamiya ........................ 709/245 |
| 5,687,292 A | * | 11/1997 | Boda et al. .................... 706/10 |
| 6,327,591 B1 | * | 12/2001 | Osborn et al. ................ 707/10 |
| 6,418,423 B1 | * | 7/2002 | Kambhatla et al. ........... 706/15 |
| 2002/0161751 A1 | * | 10/2002 | Mulgund et al. .............. 707/3 |

FOREIGN PATENT DOCUMENTS

EP    0373737 A2    6/1990

OTHER PUBLICATIONS

Aussem, Alex and Mahul, Antoine and Marie, Raymond, "Queueing Network Modelling with Distributed Neural Networks for Service Quality Estimation in B-ISDN Networks", In Proceedings IEEE-INNS-ENNS International Joint Conference on Neural Networks 5, pp. 392-397, 2000.*
A. Aussem, Call admission control in ATM networks with the random neural networks,. IEEE ICNN'94. , vol. 4, pp. 2482-2487, 1994.*
Kotsis, Gabriele; "A Systematic Approach for Workload Modelling for Parallel Processing Systems", Parallel Computing vol. 22, 1997, pp. 1771-1787.

* cited by examiner

*Primary Examiner*—Anthony Knight
*Assistant Examiner*—Adrian Kennedy

(57) ABSTRACT

According to a first aspect of the present invention there is provided a method of modelling a network comprising operating the network as a neural network and executing a neural network modelling algorithm on the network, whereby the network models its own response to a requested action.

16 Claims, 6 Drawing Sheets

NETWORK MODELLING

BACKGROUND OF THE INVENTION

A network comprises a plurality of network nodes, which are typically each either individual dataprocessors or microprocessors, physically interconnected to one another in some manner. The term 'computer' is used here in a general sense and is intended to refer to any device or component capable of performing some kind of processing task.

There are a number of different ways in which the individual networked computers can be arranged to co-operate with each other to ensure the successful operation of the network. One such way is to arrange for the individual computers to distribute, or share, the various tasks and processes amongst themselves that are required for the operation of the network, such as controlling the flow of information between the individual computers. This type of network is often referred to as a peer-to-peer network, as no simple networked computer is denoted as being more 'important' than any other.

Peer-to-peer networks tend to be more flexible in their operation and are attractive for use in scenarios where the network structure is either unknown, or prone to change. For example, a public network based on the internet, or a company intranet, is most likely to be a peer-to-peer network as the network will be subject to users logging on and off from it.

However, the distribution of tasks and responsibilities across a peer-to-peer network also tends to make it difficult to predict the behaviour of the network and in particular to predict and control instabilities that may occur due to inappropriate loads being put upon the network. Examples of such inappropriate loads include excessive demand for a resource, such as a popular media file, the transfer of the functionality to a node from a further node that has 'dropped out' of the network for some reason, or a malicious demand for resources such as occurs during a 'Denial of Service' attack.

SUMMARY OF THE INVENTION

According to a first aspect of the present invention there is provided a method of modelling a network comprising operating the network as a neural network and executing a neural network modelling algorithm on said network, whereby said network models its own response to a requested action.

Neural networks are similar to peer-to-peer networks in the sense that whilst the individual nodes of the neural network pass information between each other and each perform separate functions, there is no node in overall control. Furthermore, neural network algorithms tend to be resilient to one or more nodes ceasing to participate in the execution of the algorithm. A peer-to-peer network can therefore be operated as a neural network.

Preferably, each node of the network is arranged to perform a neural network function. Each node may also be arranged to maintain a vector of information that represents the state of that network node. Each node is therefore arranged to emulate a neural network node by performing the network function using its maintained vector, or alternatively or additionally, using one or more vectors communicated from one or more other network nodes.

The method may include issuing a warning if the modelled response to the requested action fails to conform to one or more predetermined criteria. It is therefore possible to model the network's response to a planned action prior to the actual execution of the action and to generate a warning if the modelled response indicates a potential problem arising from the planned action. In response to the issued warning the requested action may be automatically cancelled, or the action modified so as to be acceptable.

The method may alternatively or additionally comprise associating together at least one subset of network nodes and representing the subset by a single node when the neural network algorithm is executed. Additionally, the associated nodes may be modelled on a sub-network of the original network nodes that is isomorphic to the network formed by the associated nodes and remaining network nodes. This provides benefits in terms of reducing the actual number of nodes on which the neural network modelling is performed. The network nodes are grouped together in a way that represents some meaningful property of the network, such as similar functionality of the nodes, so that it is valid to represent them as a single node with a correspondingly appropriate neural function.

In addition to grouping network nodes together, the method may further comprise determining a sub-network of the original network to be used for the neural modelling in accordance with one or more parameters, such as the availability of network nodes or their ability to perform the modelling calculations, and grouping the nodes together such that the grouped network is isomorphic to the determined sub-network.

According to a second aspect of the present invention there is provided a network arranged to operate a neural network and to execute a neural network modelling algorithm in response to a request to execute an action on said network, whereby the network models its own response to the requested action.

Preferably, the network comprises a plurality of network nodes and at least a subset of said nodes are arranged to execute a neural network objective function. Additionally, each of the subset of network nodes may be arranged to maintain an information vector. Furthermore, information vector may be representative of the state of one of the plurality of network nodes.

Additionally or alternatively, at least one of the network nodes may be arranged to generate a warning if the modelled response to the requested action does not conform to at least one predetermined criteria.

Additionally or alternatively, the requested action may not be executed if the modelled response does not conform to at least one predetermined criteria.

At least one of the subset of network nodes may be arranged to maintain an information vector representative of the state of a plurality of associated network nodes. Additionally, the plurality of associated network nodes may be associated together such that the subset of network nodes maintaining said information vectors conforms to a predetermined topology.

According to a third aspect of the present invention there is provided a method of managing the allocation of tasks in a distributed network, the method comprising submitting a task allocation for execution by the network, executing a distributed modelling algorithm on the network, the modelling algorithm being arranged to model the response of the distributed network itself to the submitted task allocation, and determining if the modelled response is acceptable and if so allocating the submitted task to the network.

Furthermore, if the modelled response is not acceptable, the method include modifying the submitted task allocation and repeating the method.

BRIEF DESCRIPTION OF THE DRAWINGS

Embodiments of the present invention, given by way of illustrative example only, are described hereinafter with reference to the accompanying figures, of which:

FIG. 6b schematically illustrates the neural network for modelling the clumped network of FIG. 6a.

DESCRIPTION OF THE PREFERRED EMBODIMENTS

Figure 1:
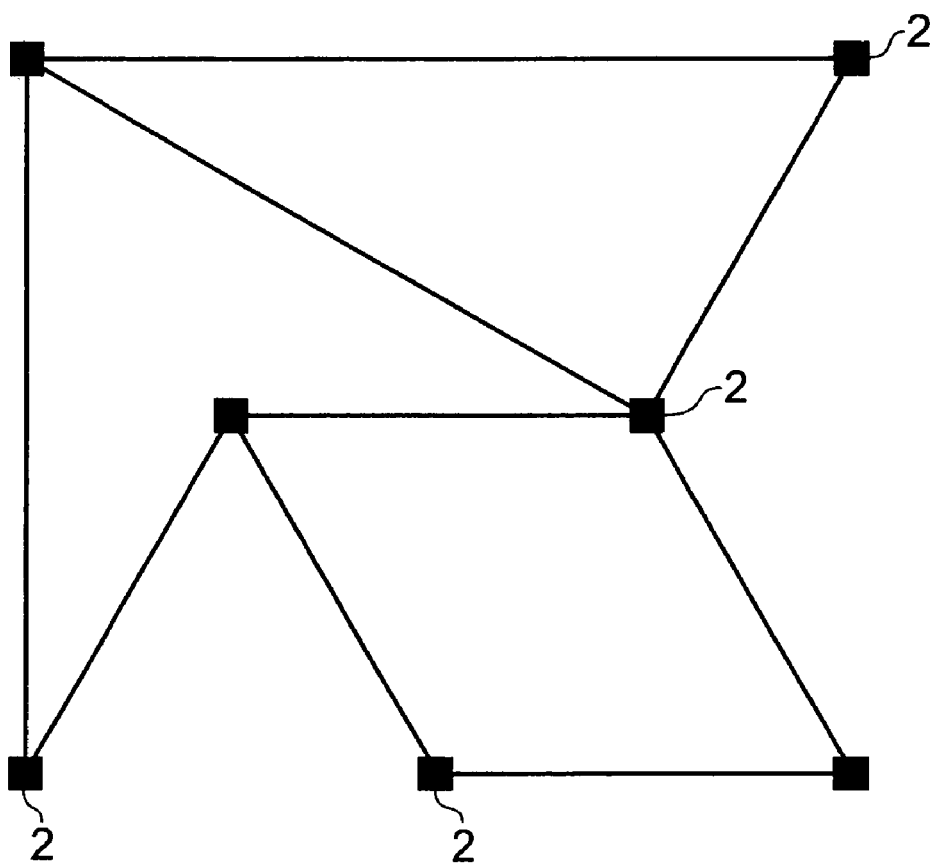
FIG. 1 schematically illustrates a peer-to-peer network.

FIG. 1 schematically illustrates a peer-to-peer network that may be modelled utilising embodiments of the present invention. The network comprises a plurality of network nodes 2, each node being connected to one or more of the other nodes within the network.

Figure 2:
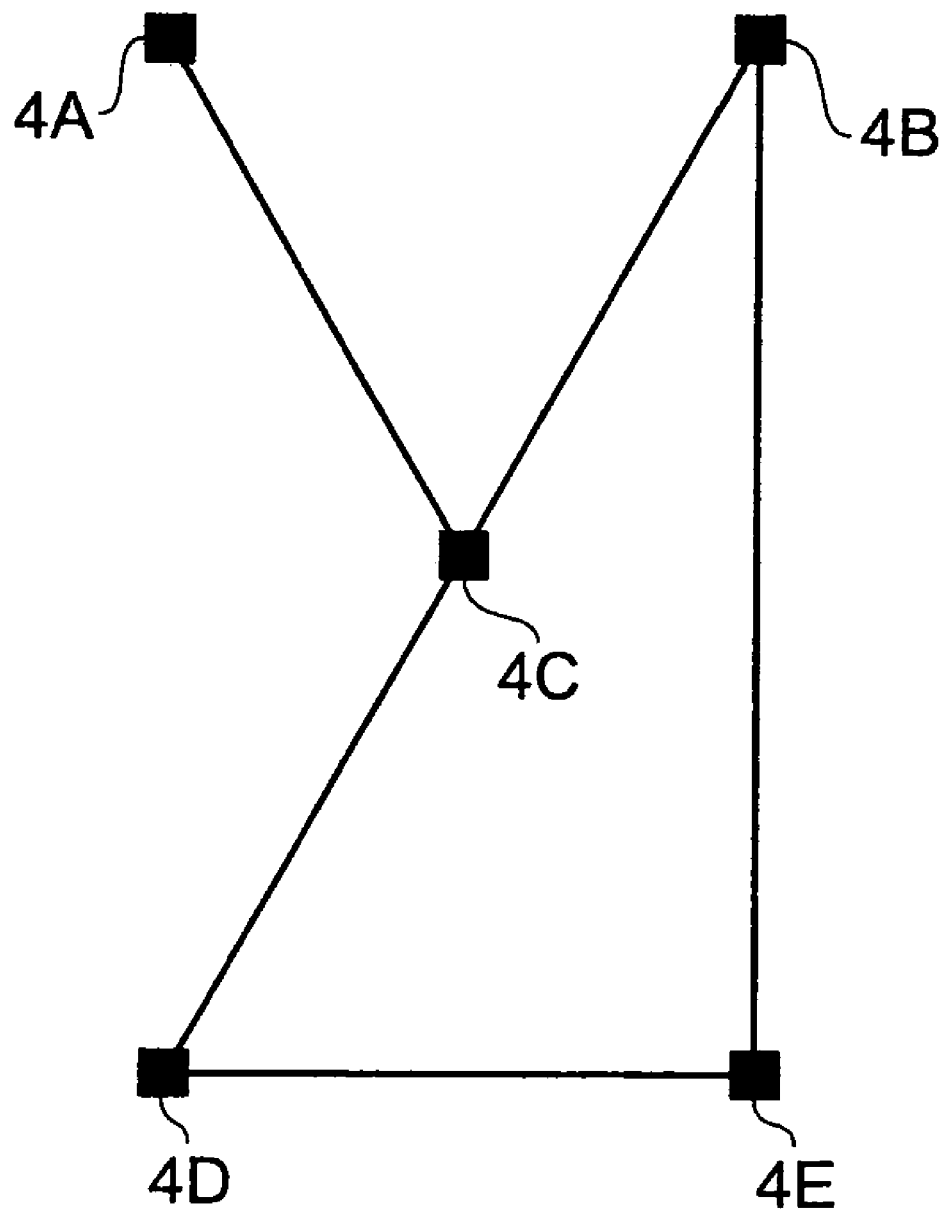
FIG. 2 schematically illustrates a neural network.

FIG. 2 schematically illustrates a neural network suitable for use in embodiments of the present invention. A plurality of network nodes, 4A to 4E are provided. Each node is connected to at least one other. A neural network operates by performing a calculation or function at each of its nodes 4A to 4E, with the input data for the calculation or function being provided by the other nodes connected to the particular node in question. The calculation or function at each node may be performed in accordance with a predetermined timing scheme. For example, nodes 4A and 4B of the network shown in FIG. 2 may be arranged to execute their respective functions first, followed by node 4C, which uses the newly derived data from nodes 4A and 4B, followed by nodes 4D and 4E. Alternatively, each node may be free to perform its associated function freely, with no particular time constraints being imposed. In both cases, calculations are iterated until a stable solution is derived. It is a feature of neural network algorithms that the absence or failure of one of the n odes does not necessarily prevent the algorithm being executed by the remaining nodes.

In embodiments of the present invention, a network, such as the peer-to-peer network shown in FIG. 1, is additionally arranged to function as a neural network. Accordingly, each network node 2 of the network maintains a vector and is arranged to execute a neural network objective function. The state of any given network node, or group of nodes, is represented by the vector maintained by that node or group of nodes. Consequently, each node in the peer-to-peer network represents itself as a node in a neural network that is topologically the same as the peer-to-peer network.

Referring to FIG. 2 the vector at each node can be represented as $V_A$ to $V_E$, each vector representing the state of that network node. Each node also has an associated objective function, $F_A$ to $F_E$. A new, calculated value of the vector for each node is calculated by performing an associated objective function. Hence, for the network shown in FIG. 2, the new value $V'_A$ of the vector $V_A$ associated with node 4A can be represented as:

$$V'_A = F_A(V_A, V_C)$$

similarly for node 4B:

$$V'_B = F_B(V_B, V_C, V_E)$$

and so on.

In embodiments of the present invention, by choosing appropriate vectors and objective functions, running the neural network algorithm results in modelling the state of the network on the network itself.

Consequently, it is possible to predict the behaviour of a network under possible future loads. As neural network algorithms are typically very efficient and converge to a stable solution quickly, the modelling function may be performed after an action is planned but before the action is actually committed to determine whether the action should be committed. The modelling function may also determine how a planned action should best be committed on the network. For example, the planned action may be to transfer the functionality of a node, or group of nodes, to another node in the network. Should the modelled response show that the proposed recipient of the functionality is not capable of performing that functionality acceptably, the action may be modified to transfer the functionality to a different node or to distribute it to a number of nodes.

Figure 3:
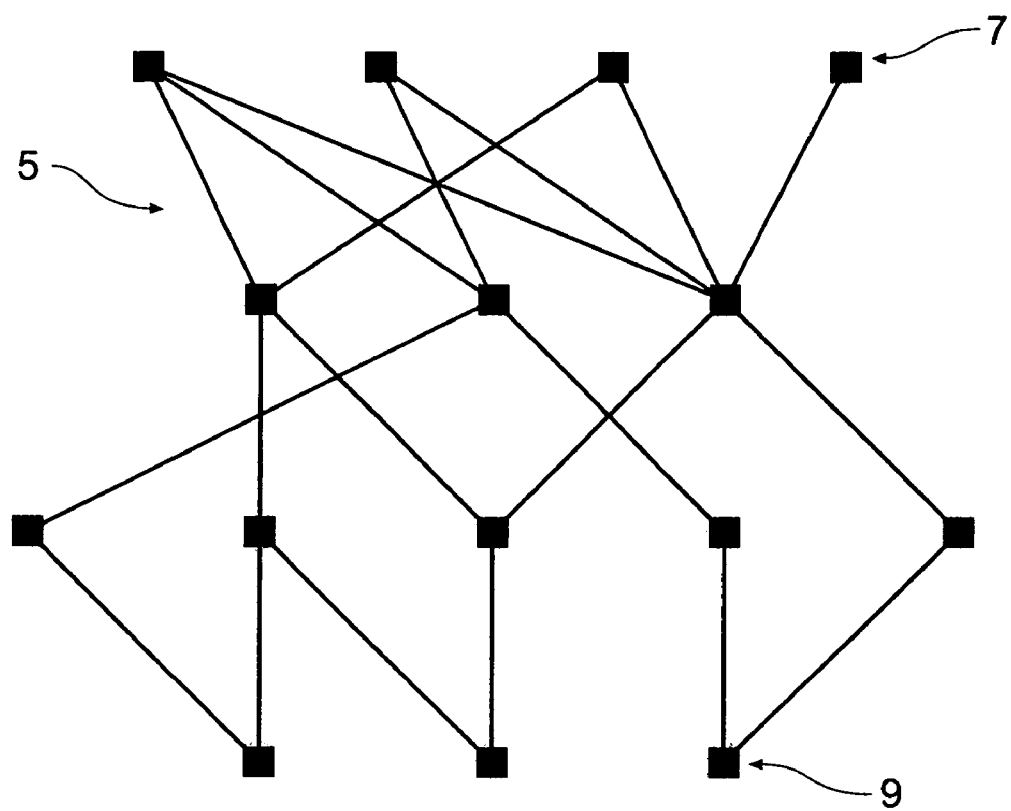
FIG. 3 illustrates a further example of a network according to an embodiment of the present invention.
Figure 4:
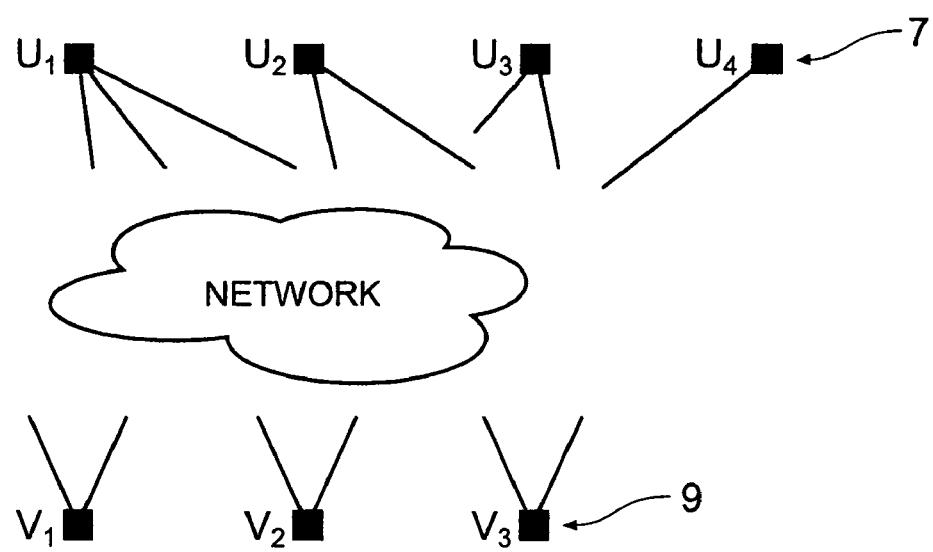
FIG. 4 illustrates the input and output layers of the network shown in FIG. 3.
Figure 5:
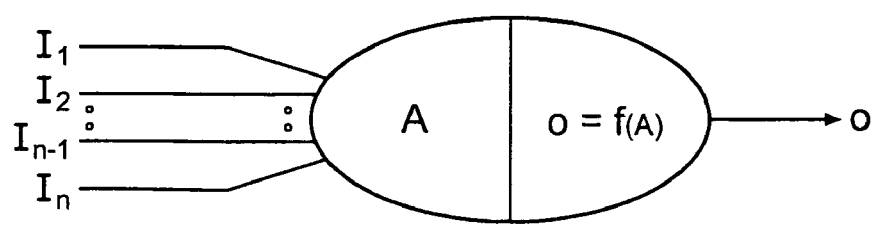
FIG. 5 illustrates the processing activity performed at a network element of the network shown in FIGS. 3 and 4.

A further example is illustrated in FIGS. 3–5. FIG. 3 shows a network 5 in which there is layering of network elements. The two outer layers 7, 9 correspond to an 'input' and 'output' respectively. The function of the network 5 itself, when acting as a neural network, is to calculate a vector value $V_{on}$ the output network elements 9 whenever an input vector value U is presented to the input network elements 7. This is illustrated in FIG. 4, where the input network elements 7 are individually labelled $U_1$ to $U_4$, thus providing an input vector U of:

$$U = \begin{pmatrix} U_1 \\ U_2 \\ U_3 \\ U_4 \end{pmatrix}$$

Similarly, the output vector $$V = \begin{pmatrix} V_1 \\ V_2 \\ V_3 \end{pmatrix}$$

As mentioned previously, each network element corresponds to a neuron in a neural network. Each neuron has an 'activation' value A associated with it and each network connection connected to the neuron has a weight w associated with it and carries incoming activation values 1 from neurons in the previous layer. Each neuron will have a fixed activation function f with which it calculates its activation value. Hence the output of the neuron is f(A), with $$A = \sum_{i=1}^{n} liWi$$

This is illustrated schematically in FIG. 5. As will be appreciated the calculation of the activation function will be calculated by the processor of the network element to which each neuron corresponds.

When the neural network runs, a vector value is applied to the input 7 layer such that the individual scalar elements of the input vector U correspond to activation values of the input layer neurons. These activation values are propagated to the next layer of neurons which then calculate their activations. This is repeated until the output layer is reached. The output values of the output layer 9 neurons are read off as the values of the scalar elements of the output vector V.

In this way, the neural network calculates some output value corresponding to some input value. For example, the output values may correspond to the additional CPU loads experienced by one set of network elements ($N_k$) if another set of network elements ($M_k$) start network broadcasting at certain rates, so that $u_i$ is the network broadcasting rate of element $M_i$ and $v_j$ is the resulting CPU load of element $N_j$.

The values of the "weights" have to be determined in some fashion before the neural network can work normally. The values of the weights are determined in a process called "training". This is usually performed using standard techniques such as "back propagation" (which corresponds to the well known method of error minimisation by method of steepest descent).

For the above example, the training regime will require a set of model examples that will probably have been obtained by actual measurement on the network. These models will be pairs of input-output values and when the network has been trained, the weights will have been chosen to minimise some error function that represents the difference between the expected output value of the neural network when presented with a training input value and the actual output. In this way the network is trained to calculate, as closely as possible, the output value corresponding to the input value for each pair in the training set.

It has been found that if the training set covers a reasonably comprehensive set of typical input-output value pairs, then the neural network will provide good answers (ones that correspond with what will actually happen in the network under consideration) when it is presented with input values that are different from ones that are in the training set. This includes the case where the functional behaviour of the output corresponding to the input is masked by other things going on on the network. The training algorithm prepares the neural network to generalise answers from the training set. In this way a relatively small number of measurements to provide the training set will allow the neural network to model arbitrary behaviour in the actual network.

Figure 6A:
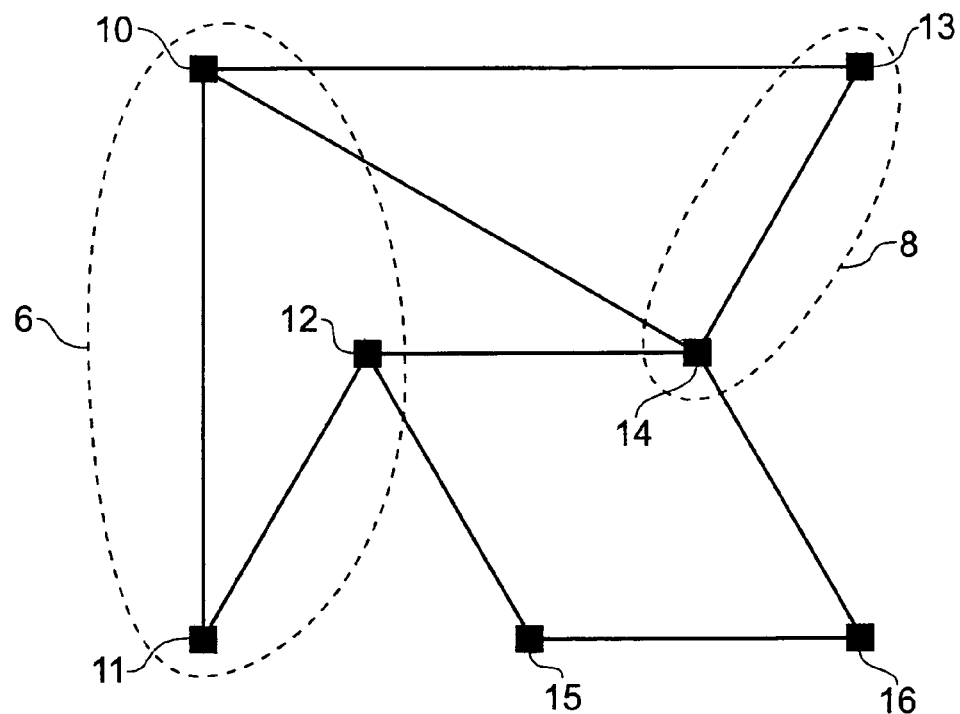
FIG. 6a schematically illustrates the network of FIG. 1 having a number of clumped nodes.
Figure 6B:
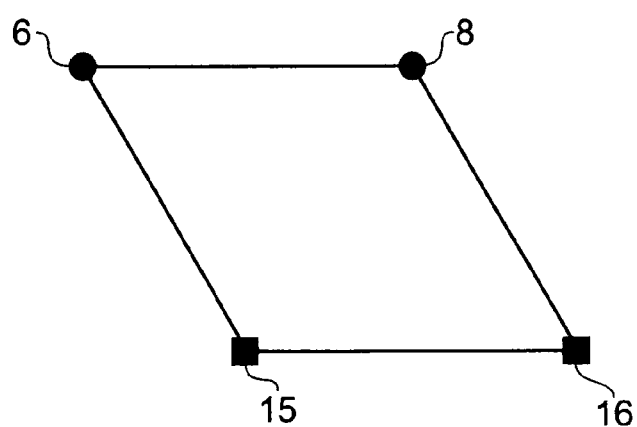

In further embodiments of the present invention, two or mote nodes of the peer-to-peer network may be grouped together and the network of groups modeled on a sub-network of the original peer-to-peer network that is isomorphic to the grouped network. By grouping the network nodes together so that the grouped network is isomorphic, or topologically identical, to the sub-network on which self-modelling is to be executed, the topological identity between the neural network and the network that is being modelled is maintained. This is illustrated in FIGS. 6a and 6b. FIG. 3a schematically illustrates the same peer-to-peer network as shown in FIG. 1. For the sake of clarity, each node is uniquely numbered. A first set of the network nodes, numbered 10–12, have been grouped together in a first group 6, whilst a second set of network nodes, numbered 13 and 14, have also been grouped together in a further group 8. This is schematically illustrated in FIG. 6a The grouped nodes 6, 8 are represented in FIG. 6b as single nodes together with their connections to the remaining nodes, numbered 15 and 16, of the original peer-to-peer network. It can be seen that the grouped network shown in FIG. 6b is isomorphic to the group of four original network nodes 12, 14, 15 and 16. Connections between individual nodes within a group, for example between the nodes numbered 10 and 11, are internalised within the node 6 of FIG. 6b, whilst other interconnections such as those between nodes 10 and 13, 10 and 14 or 12 and 14 are represented by the single interconnection between grouped nodes 6 and 8. It therefore becomes possible to model the clumped network illustrated in FIG. 6b using just those four nodes on the original peer-to-peer network.

In embodiments of the present invention that make use of grouped networks as described above, it is preferable that the nodes of the peer-to-peer network that are grouped together are selected in a way that represents some meaningful property of the network. For example, adjacent network nodes that are known to perform similar operations or to behave in a similar manner may be sensibly grouped together. An advantage of modelling the grouped network is that the number of nodes used to implement the neural network is reduced, thus making more efficient use of the available network resources and, possibly, achieving the modelling outcome in a reduced time period.

In further embodiments of the present invention the nodes of the peer-to-peer network are dynamically grouped together so that the topology of the grouped network is isomorphic to some sub-network of the original network that happens to be available or most suitable to do the modelling functions. This may be achieved by one or more of the network nodes monitoring the usage of each of the network nodes to determine those nodes having the most spare processing capacity at any given time, or alternatively by maintaining a register of the nominal processing capabilities of each network node and clumping the nodes of the original network such that the isomorphic sub-network includes those nodes having the most appropriate processing capabilities for the given modelling task.

Figure 7A:
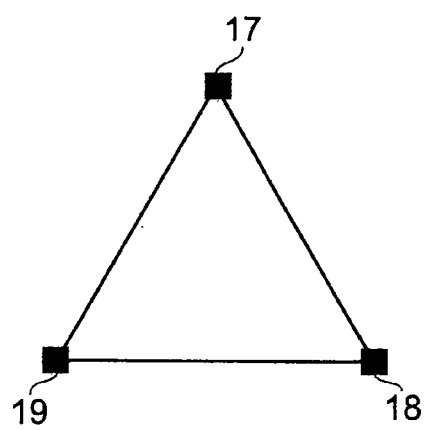
FIGS. 7(a) and 7(b) schematically illustrate a further network and its isomorphic dual.
Figure 7B:
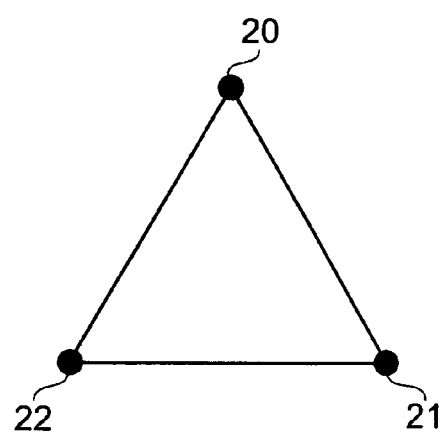

A further variant according to embodiments of the present invention is illustrated schematically in FIGS. 7a and 7b, in which a further network of peer-to-peer network nodes is shown. For the sake of simplicity, the network comprises only three network nodes, numbered 17–19, connected in the form of an equilateral triangle. As will be well known to those skilled in the art, it is possible to determine an automorphism of a network, the automorphic image itself comprising a number of interconnected nodes. An automorphism is a mapping function that when applied to a network generates a new network that is topologically identical to the original network. The network produced by applying the automorphism is referred to as the automorphic image. In FIG. 7a the automorphism comprises effectively rotating the network by 120°. Hence node 17 is mapped onto node 18, node 18 is mapped onto node 19 and so on. It will be easily appreciated that the resulting mapped network, shown in FIG. 7b, is topologically identical to the original network, i.e. the mapped network shown in FIG. 7b is an automorphic image of the network shown in FIG. 7a. Each interconnection between the nodes 17–19 of the original network is represented in its automorphic image by a node 20–22. If the network interconnections represented by nodes in the automorphic image are incident on the same network node, an interconnection between those nodes in the automorphic image is made. For example, the network interconnections represented by nodes 20 and 22 in the automorphic image are both incident on network node 17. Therefore there is an interconnection between nodes 20 and 22 in the automorphic image. Furthermore, the automorphism may be selected such that the network node onto which a node of the automorphic image is mapped is topologically remote from the network interconnection represented by the image of that node under automorphism. In embodiments of the present invention advantage of this feature is taken by arranging for the neural network to be equivalent to an automorphism of original network. That is to say that although topologically equivalent to the original network, the neural network is based on an isomorphic image, such that for any given node or the original network that node is modelled at a different node when the network is operated as a neural network. This has the advantage of providing a degree of fault tolerance within the network.

The embodiments of the present invention therefore provide an improved method of modelling the response of a network, in particular a peer-to-peer network.

What is claimed is:

1. A method of modelling a network comprising operating said network as a neural network and executing a neural network modelling algorithm on said network, whereby said network models its own response to a requested action, wherein at least one subset of network nodes having at least two members are associated together and represented by a single node when said neural network algorithm is executed; said neural network modelling algorithm is executed on a sub-network of said network nodes, the sub-network being isomorphic to the network formed by said at least one subset of associated network nodes and remaining network nodes; and the network nodes are associated together such that said resulting network is isomorphic to a predetermined sub-network of network nodes.

2. A method according to claim 1, wherein said sub-network of network nodes is determined according to at least one network parameter.

3. A method according to claim 1, wherein said network comprises a plurality of network nodes and at least a subset of said nodes are each arranged to execute a neural network objective function.

4. A method according to claim 3, wherein each of said subset of network nodes is arranged to maintain an information vector.

5. A method according to claim 4, wherein said information vector is representative of the state of one of the plurality of network nodes.

6. A method according to claim 4, wherein each of said subset of network nodes executes said neural network objective function using at least one of said information vectors as an operand.

7. A method according to claim 1, wherein a warning is issued if the modelled response to the requested action fails to conform to at least one predetermined criteria.

8. A method according to claim 1, wherein said requested action is not committed if the modelled response to the requested action fails to conform to at least one predetermined criteria.

9. A network arranged to operate as a neural network and to execute a neural network modelling algorithm in response to a request to execute an action on said network, whereby the network models its own response to the requested action, wherein at least one subset of network nodes having at least two members are associated together and represented by a single node when said neural network algorithm is executed; said neural network modelling algorithm is executed on a sub-network of said network nodes, the sub-network being isomorphic to the network formed by said at least one subset of associated network nodes and remaining network nodes; and the network nodes are associated together such that said resulting network is isomorphic to a predetermined sub-network of network nodes.

10. A network according to claim 9, wherein said network comprises a plurality of network nodes and at least a subset of said nodes are each arranged to execute a neural network objective function.

11. A network according to claim 10, wherein each of said subset of network nodes is arranged to maintain an information vector.

12. A network according to claim 11, wherein said information vector is representative of the state of one of the plurality of network nodes.

13. A network according to claim 11, wherein at least one of said subset of network nodes is arranged to maintain an information vector representative of the state of a plurality of associated ones of said network nodes.

14. A network according to claim 13, wherein the plurality of associated network nodes are associated together such that the subset of network nodes maintaining said information vectors conforms to a predetermined topology.

15. A network according to claim 10, wherein at least one of said network nodes is arranged to generate a warning if the modelled response to the requested action does not conform to at least one predetermined criteria.

16. A network according to claim 9, wherein said requested action is not executed if the modelled response does not conform to at least one predetermined criteria.

* * * * *